United States Patent
Amikura et al.

(10) Patent No.: US 11,791,180 B2
(45) Date of Patent: Oct. 17, 2023

(54) SUBSTRATE TRANSFER SYSTEM AND LOAD LOCK MODULE

(71) Applicant: TOKYO ELECTRON LIMITED, Tokyo (JP)

(72) Inventors: Norihiko Amikura, Miyagi (JP);
Masahiro Dogome, Miyagi (JP);
Masatomo Kita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 262 days.

(21) Appl. No.: 17/195,322

(22) Filed: Mar. 8, 2021

(65) Prior Publication Data
US 2021/0280441 A1    Sep. 9, 2021

(30) Foreign Application Priority Data
Mar. 9, 2020   (JP) .................................. 2020-040263

(51) Int. Cl.
*H01L 21/67*   (2006.01)
*H01L 21/677*  (2006.01)

(52) U.S. Cl.
CPC .. *H01L 21/67201* (2013.01); *H01L 21/67167* (2013.01); *H01L 21/67745* (2013.01); *H01L 21/67748* (2013.01); *H01L 21/67751* (2013.01)

(58) Field of Classification Search
CPC ......... H01L 21/67201; H01L 21/67167; H01L 21/67745; H01L 21/67748; H01L 21/67751; H01L 21/67781
See application file for complete search history.

(56) References Cited

U.S. PATENT DOCUMENTS

2008/0236488 A1* 10/2008 Takeshita ............ C23C 16/4401
                                                          438/758
2014/0003891 A1*  1/2014 Kobayashi ........ H01L 21/67201
                                                          414/217

FOREIGN PATENT DOCUMENTS

JP        2017-18875 A     1/2015

* cited by examiner

*Primary Examiner* — Ronald P Jarrett
(74) *Attorney, Agent, or Firm* — WEIHROUCH IP

(57) ABSTRACT

A substrate transfer system includes an atmospheric substrate transfer module, a vacuum substrate transfer module, and a load lock module disposed on a side surface of the atmospheric substrate transfer module and disposed on an upper surface or a lower surface of the vacuum substrate transfer module. The load lock module includes a container having a first substrate transfer opening and a second substrate transfer opening, a first gate configured to open or close the first substrate transfer opening, a second gate configured to open or close the second substrate transfer opening, and a substrate actuator configured to vertically move a substrate through the second substrate transfer opening between a first position in the container and a second position in the vacuum substrate transfer module.

11 Claims, 16 Drawing Sheets

SUBSTRATE TRANSFER SYSTEM AND LOAD LOCK MODULE

CROSS-REFERENCE TO RELATED APPLICATIONS

This application claims priority to Japanese Patent Application No. 2020-040263, filed on Mar. 9, 2020, the entire contents of which are incorporated herein by reference.

TECHNICAL FIELD

Various aspects and embodiments of the present disclosure relate to a substrate transfer system and a load lock module.

BACKGROUND

Japanese Patent Application Publication No. 2015-18875 (JP2015-18875) discloses a semiconductor manufacturing apparatus including three carrier mounting stages on each of which a substrate transfer container that stores a predetermined number of wafers to be processed is mounted. The semiconductor manufacturing apparatus disclosed in JP2015-18875 includes a first transfer chamber in which a wafer is transferred under an atmospheric atmosphere. The semiconductor manufacturing apparatus disclosed in JP2015-18875 includes, for example, two horizontally-arranged load lock chambers for holding the wafer therein while switching the internal atmosphere of each load lock chamber between an atmospheric atmosphere and a vacuum atmosphere. Further, the semiconductor manufacturing apparatus disclosed in JP2015-18875 includes a second transfer chamber in which the wafer is transferred under a vacuum atmosphere and, for example, four processing modules for processing the loaded wafer. Further, JP2015-18875 discloses a transfer device installed in the first transfer chamber. The transfer device of JP2015-18875 has a base configured to be vertically movable and further movable along a longitudinal direction of the first transfer chamber by a driving mechanism and thus may transfer and receive the wafer between an alignment chamber and the substrate transfer container.

SUMMARY

The present disclosure provides a substrate transfer system and a load lock module capable of reducing an installation area thereof.

In accordance with an aspect of the present disclosure, there is provided a substrate transfer system including: an atmospheric substrate transfer module; a vacuum substrate transfer module; and a load lock module disposed on a side surface of the atmospheric substrate transfer module and disposed on an upper surface or a lower surface of the vacuum substrate transfer module.

The load lock module includes: a container having a first substrate transfer opening and a second substrate transfer opening, the first substrate transfer opening being formed in a side surface of the container to communicate an interior of the container with the atmospheric substrate transfer module, and the second substrate transfer opening being formed in a lower surface or an upper surface of the container to communicate the interior of the container with the vacuum substrate transfer module; a first gate configured to open or close the first substrate transfer opening; a second gate configured to open or close the second substrate transfer opening; and a substrate actuator configured to vertically move a substrate through the second substrate transfer opening between a first position in the container and a second position in the vacuum substrate transfer module, the first position being located at the same height as the first substrate transfer opening.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of a substrate transfer system and a load lock module will be described in detail with reference to accompanying drawings. In addition, the substrate transfer system and the load lock module to be described are not limited by the following embodiments.

In order to increase the number of substrates that can be processed per unit time, it may be an option to increase the number of processing modules that process the substrates. However, as the number of the processing modules increases, a substrate processing system, which includes the plurality of processing modules, a vacuum substrate transfer module, a load lock module, an atmospheric substrate transfer module, and the like, becomes larger in size. When the size of the substrate processing system increases, the installation area (footprint) of the substrate processing system in a facility such as a clean room also increases, which makes it difficult to arrange a plurality of substrate processing systems. Therefore, there is a demand for reducing the installation area of the substrate processing system.

Accordingly, the present disclosure provides a technique for reducing the installation area of the substrate processing system.

First Embodiment (Configuration of Substrate Processing System 1)

Figure 1:
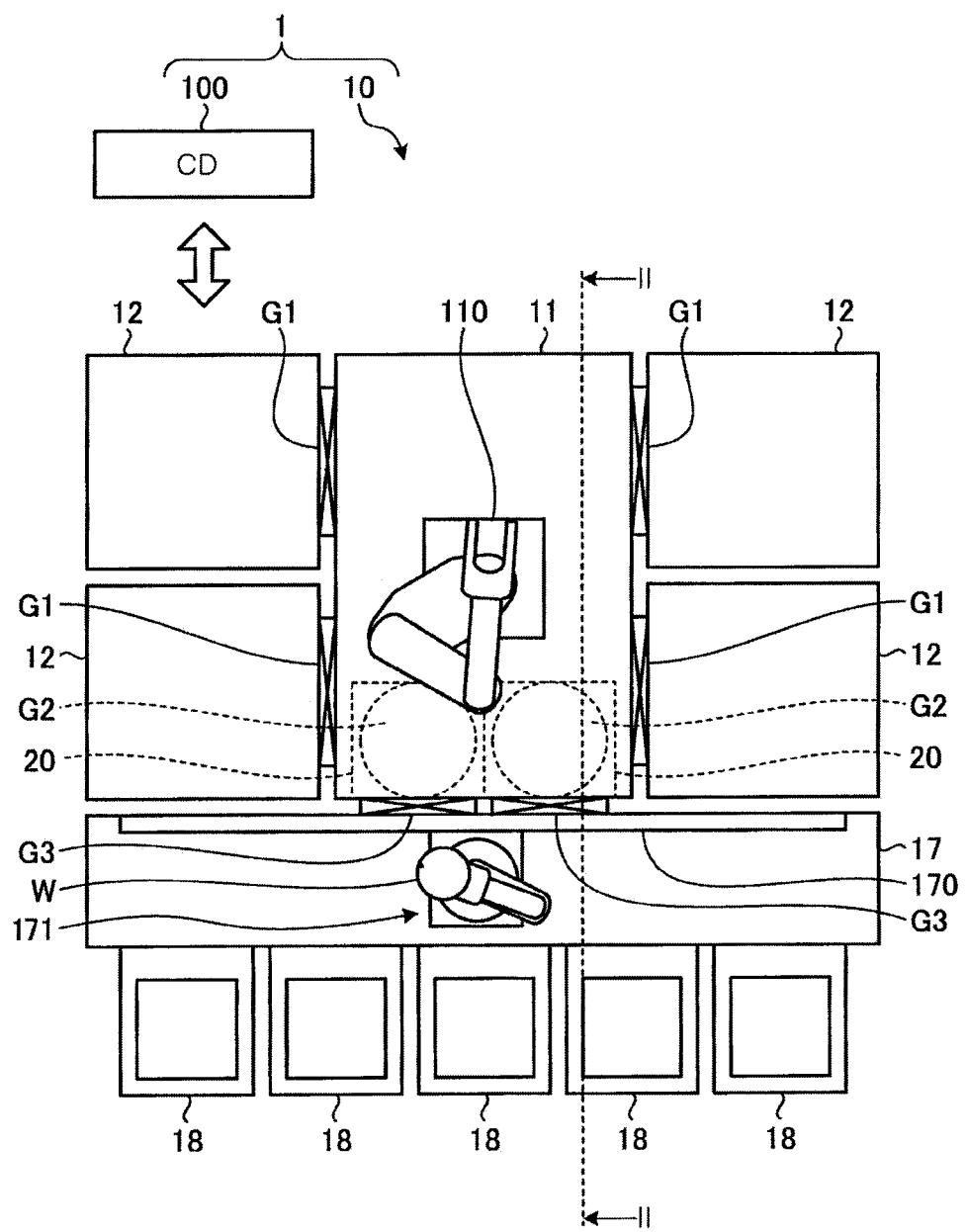
FIG. 1 is a plan view illustrating an example of a substrate processing system according to a first embodiment.
Figure 2:
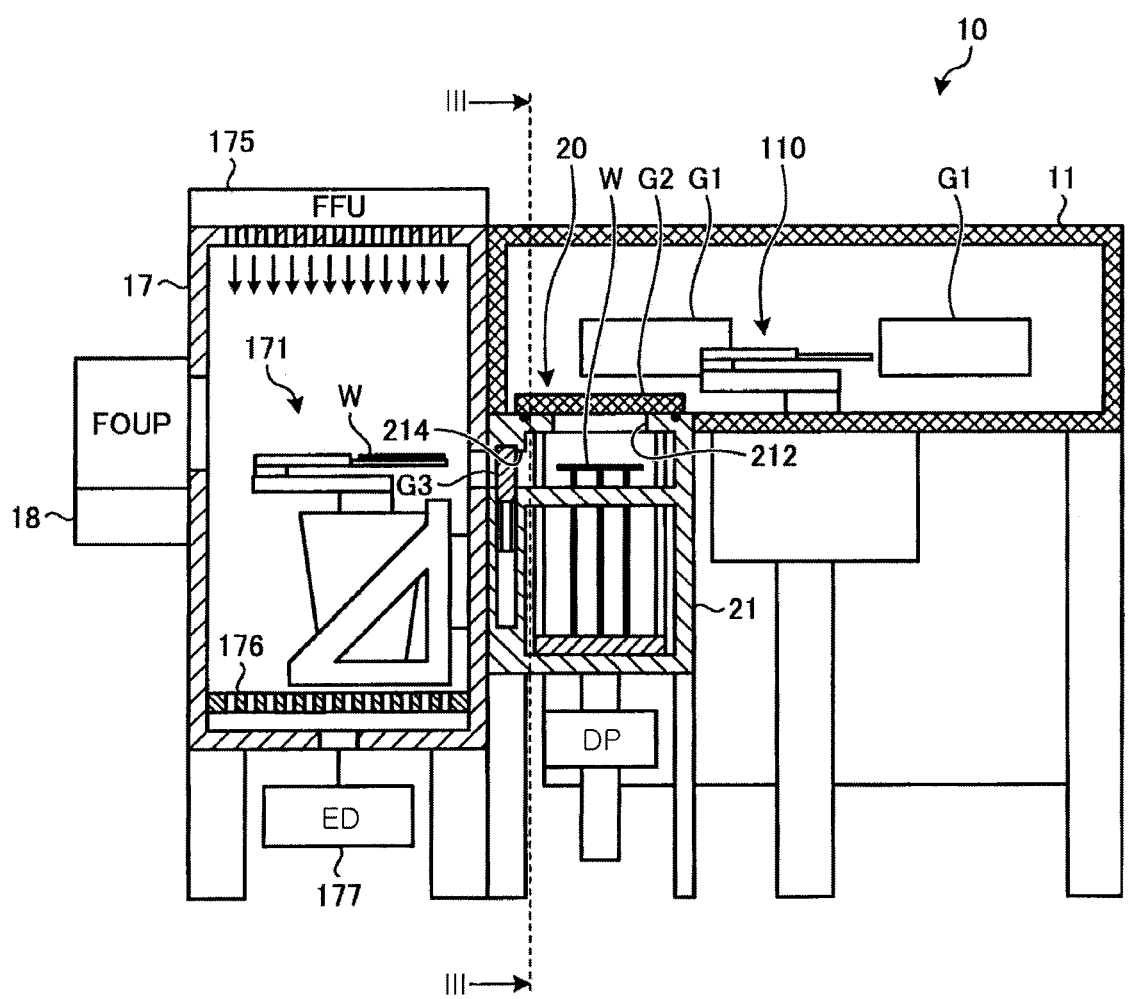
FIG. 2 an example of a cross sectional view taken along a broken line II-II of the substrate processing system 1 shown in FIG. 1.
Figure 3:
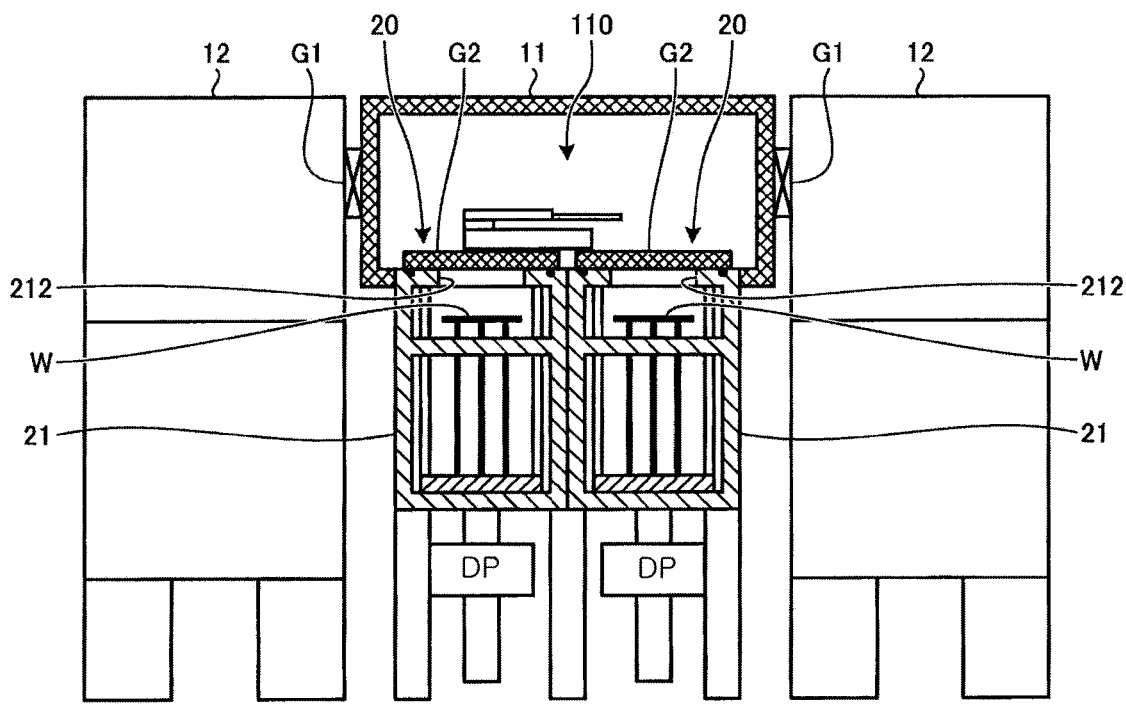
FIG. 3 is an example of a cross sectional view taken along a broken line III-III of the substrate processing system 1 shown in FIG. 2.

FIG. 1 is a plan view illustrating an example of a configuration of a substrate processing system 1 according to a first embodiment. FIG. 2 is an example of a cross sectional view taken along a broken line II-II of the substrate processing system 1 shown in FIG. 1. FIG. 3 is an example of a cross sectional view taken along a broken line III-III of the substrate processing system 1 shown in FIG. 2. In FIG. 1, some internal components of devices are illustrated transparently for easier understanding. The substrate processing system 1 includes a main body 10 and a control device (CD) 100 that controls the main body 10.

The main body 10 includes a vacuum substrate transfer module 11, a plurality of substrate processing modules 12, an atmospheric substrate transfer module 17, a plurality of load ports 18, and a plurality of load lock modules 20. The vacuum substrate transfer module 11 is configured to transfer a substrate under a vacuum atmosphere. In addition, the term "vacuum" used in the present specification may refer to a pressure lower than the atmospheric pressure and may be described as "reduced pressure" or "low pressure."

In the present embodiment, the vacuum substrate transfer module 11 is configured to transfer a substrate between the substrate processing module 12 and the load lock module 20 or between the plurality of substrate processing modules 12 under a vacuum atmosphere. The atmospheric substrate transfer module 17 is configured to transfer the substrate under an atmospheric pressure atmosphere. In the present embodiment, the atmospheric substrate transfer module 17 is configured to transfer the substrate between front opening unified pods (FOUPs) on the load ports 18 and the load lock modules 20 under an atmospheric pressure atmosphere.

A plurality of substrate transfer openings are formed in sidewalls of the vacuum substrate transfer module 11, and gate valves G1 capable of opening or closing the corresponding substrate transfer openings are installed at the substrate transfer openings. In the example of FIG. 1, two substrate transfer openings are formed in a first sidewall of the vacuum substrate transfer module 11, and the gate valve G1 is installed at each substrate transfer opening. Furthermore, two substrate transfer openings are formed in a second sidewall opposite to the first sidewall, and the gate valve G1 is installed at each substrate transfer opening. Each substrate processing module 12 may communicate with the vacuum substrate transfer module 11 through the corresponding substrate transfer opening. In the example of FIG. 1, although a case where the four substrate processing modules 12 are connected to the vacuum substrate transfer module 11 is illustrated, the number of the substrate processing modules 12 connected to the vacuum substrate transfer module 11 may be three or less or may be five or more.

Each substrate processing module 12 performs processing such as etching or film forming (for example, a plasma process) on the substrate W. The substrate processing modules 12 may perform the same process or different processes in a manufacturing process.

In addition, as shown in the exemplary embodiments depicted in FIGS. 2 and 3, a plurality of openings 212 may be formed in a lower surface of the vacuum substrate transfer module 11 and an upper surface of the plurality of load lock modules 20 (containers 21 which will be described below). Gate valves G2 capable of opening or closing the corresponding openings 212 are installed at the openings 212, respectively. The interior of each load lock module 20 may communicate with the interior of the vacuum substrate transfer module 11 through the corresponding opening 212 and the gate valve G2. The opening 212 is an example of a second substrate transfer opening. The gate valve G2 is an example of a second gate. In the examples of FIGS. 1 to 3, although a case where the two load lock modules 20 are connected to the vacuum substrate transfer module 11 is illustrated, the number of the load lock modules 20 connected to the vacuum substrate transfer module 11 may be one or may be three or more.

In the vacuum substrate transfer module 11, a transfer robot 110 is provided. The transfer robot 110 is an example of a second transfer robot. The transfer robot 110 transfers the substrate W between the substrate processing module 12 and the load lock module 20. The substrate W is transferred between the substrate processing module 12 and the load lock module 20 through the vacuum substrate transfer module 11 by the transfer robot 110. The interior of the vacuum substrate transfer module 11 may be maintained under a vacuum atmosphere (for example, a predetermined pressure lower than the atmospheric pressure, which may be referred to as "low pressure" in some cases described below).

In addition, as shown in the exemplary embodiments depicted in FIGS. 2 and 3, a plurality of substrate transfer openings are formed in a side surface of the atmospheric substrate transfer module 17 and side surfaces of the plurality of load lock modules 20 (containers 21 which will be described below). Gate valves G3 capable of opening or closing the corresponding substrate transfer opening are mounted in the substrate transfer openings. Each load lock module 20 may communicate with the atmospheric substrate transfer module 17 through the corresponding substrate transfer opening. The substrate transfer opening formed in the side surface of each load lock module 20 is an opening 214 to be described below. The opening 214 is an example of a first substrate transfer opening. The gate valve G3 is an example of a first gate. After the substrate W is transferred from the atmospheric substrate transfer module 17 through the opening 214, the load lock module 20 closes the gate valve G3. A pressure in the load lock module 20 may be reduced from the atmospheric pressure to a predetermined low pressure by an exhaust device (not shown). The load lock module 20 opens the gate valve G2, and the substrate W in the load lock module is transferred into the vacuum substrate transfer module 11 through the opening 212.

In addition, in a state in which the interior of the load lock module 20 is maintained at the low pressure (that is, in a vacuum atmosphere), the substrate W is transferred from the vacuum substrate transfer module 11 through the opening 212, and thereafter the load lock module 20 closes the gate valve G2. A gas (for example, air) may be supplied into the load lock module 20 using a gas supply device (not shown), thereby increasing the pressure in the load lock module 20 from the low pressure to the atmospheric pressure. The load lock module 20 opens the gate valve G3, and the substrate W in the load lock module 20 is transferred into the atmospheric substrate transfer module 17 through the opening 214.

On a sidewall of the atmospheric substrate transfer module 17 that is opposite to the sidewall of the atmospheric substrate transfer module 17 to which the load lock module 20 is connected, the plurality of load ports 18 are installed. The FOUP for accommodating a plurality of substrates W is connected to each load port 18.

A transfer robot 171 is provided in the atmospheric substrate transfer module 17. The transfer robot 171 is an example of a first transfer robot. The transfer robot 171 transfers the substrate W between the FOUP connected to the load port 18 and the load lock module 20. A guide rail 170 is provided on the sidewall of the atmospheric substrate transfer module 17 to which the load lock module 20 is connected. The transfer robot 171 moves back and forth in the atmospheric substrate transfer module 17 along the guide rail 170.

For example, as shown in FIG. 2, a fan filter unit (FFU) 175 is provided on an upper portion of the atmospheric substrate transfer module 17. The FFU 175 supplies air, from which particles and the like are removed (hereinafter referred to as "clean air"), into the atmospheric substrate transfer module 17 from the upper portion of the atmospheric substrate transfer module 17. A perforated floor 176 is provided at a bottom portion of the atmospheric substrate transfer module 17, and an exhaust device (ED) 177 for exhausting clean air in the atmospheric substrate transfer module 17 is connected to the bottom of the atmospheric substrate transfer module 17 below the perforated floor 176. The clean air supplied from the FFU 175 is exhausted through the perforated floor 176 by the exhaust device 177, so that a downflow of the clean air is formed in the atmospheric substrate transfer module 17. As a result, it is possible to suppress particles and the like from swirling upward in the atmospheric substrate transfer module 17. In addition, the exhaust device 177 may control a pressure in the atmospheric substrate transfer module 17 such that the interior of the atmospheric substrate transfer module 17 has a positive pressure. As a result, it is possible to suppress external particles and the like from entering the atmospheric substrate transfer module 17.

The control device 100 includes a memory, a processor, and an input/output interface. The memory stores data such as recipes, and programs. For example, the memory may include a random access memory (RAM), a read only memory (ROM), a hard disk drive (HDD), a solid state drive (SSD), or the like. The processor executes a program read from the memory to control each unit of the main body 10 through the input/output interface based on the data such as the recipe stored in the memory. The processor may be a central processing unit (CPU) or a digital signal processor (DSP).

As described above, in the present embodiment, the load lock module 20 is connected to the lower surface of the vacuum substrate transfer module 11 through the gate valve G2, and the atmospheric substrate transfer module 17 is connected to the side surface of the load lock module 20 through the gate valve G3. Therefore, the load lock module 20 is disposed on the side surface of the atmospheric substrate transfer module 17 and is also disposed on the lower surface of the vacuum substrate transfer module 11. As a result, the installation area of the substrate processing system 1 can be reduced as compared with a case where the load lock module 20 is disposed between the vacuum substrate transfer module 11 and the atmospheric substrate transfer module 17.

(Configuration of Load Lock Module 20)

Figure 4:
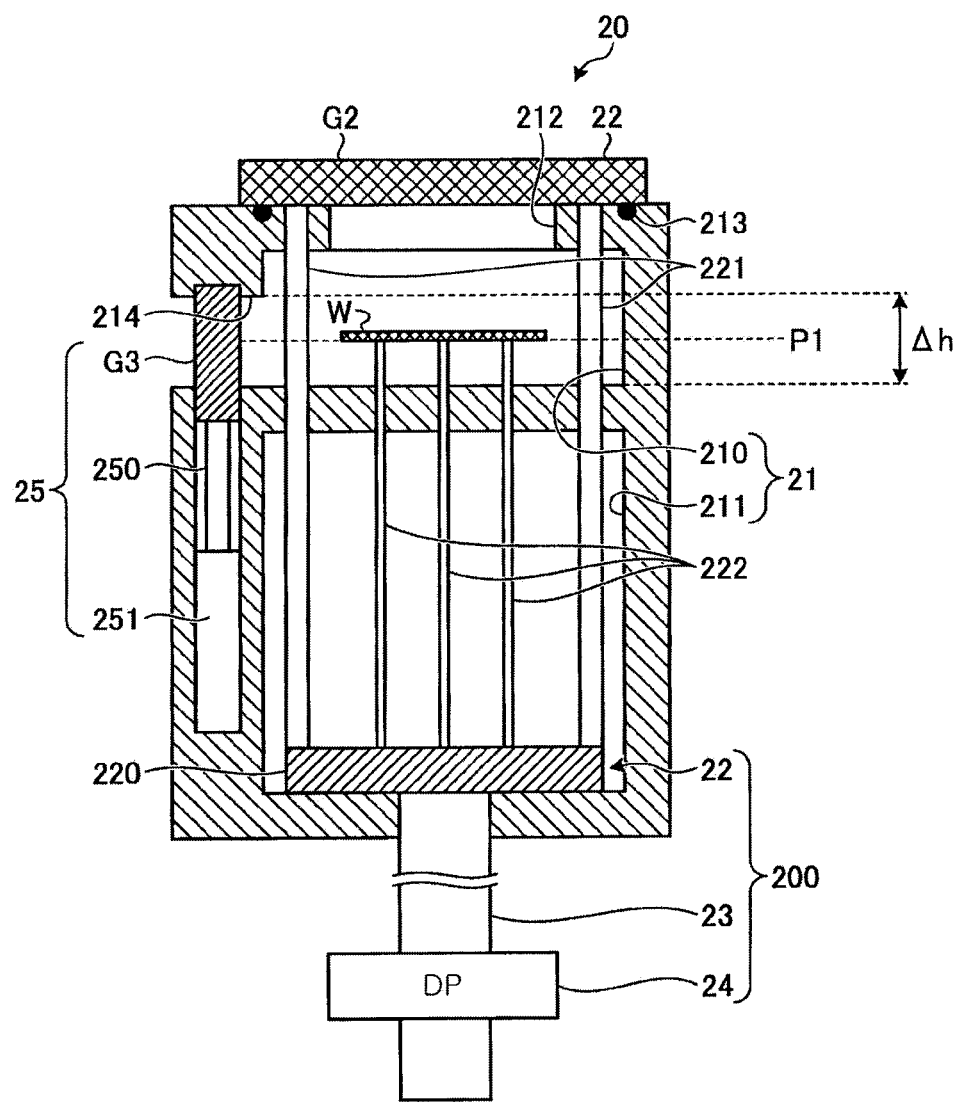
FIG. 4 is a cross-sectional view illustrating an example of a load lock module in the first embodiment.

FIG. 4 is a cross-sectional view illustrating an example of the load lock module 20 according to the first embodiment. The load lock module 20 includes a container 21, a gate mechanism 25, and an actuator 200. The container 21 includes a first container 210 and a second container 211. The actuator 200 includes a gate structure 22, a support portion 23, and a driving part (DP) 24. The actuator 200 is an example of a substrate actuator.

The opening 212 having an inner shape greater than an outer shape of the substrate W is formed in an upper surface of the first container 210. A sealing member 213 such as an O-ring is installed on an upper surface of the container 21 around the opening 212 so as to surround the opening 212. The opening 214 having an inner shape greater than the outer shape of the substrate W is formed in a side surface of the first container 210. The substrate W is transferred in the first container 210. The exhaust device and the gas supply device (not shown) are connected to the first container 210. The exhaust device connected to the first container 210 may reduce a pressure in the first container 210 to a predetermined pressure lower than atmospheric pressure. Furthermore, the gas supply device connected to the first container 210 may supply a gas (for example, air) into the first container 210 to increase the pressure in the first container 210 to atmospheric pressure.

Figure 5:
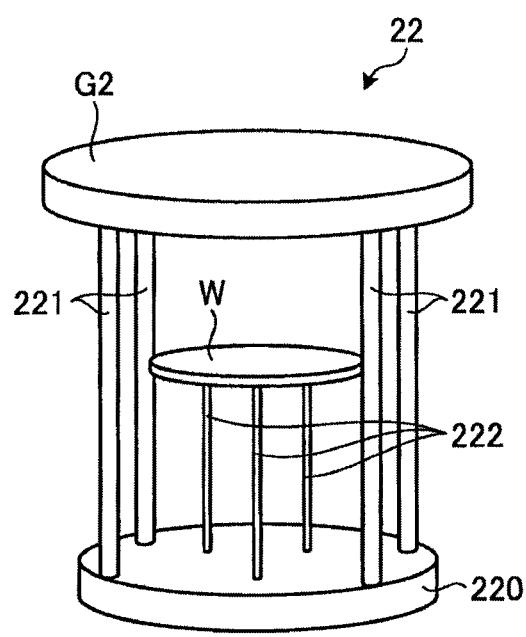
FIG. 5 is a perspective view illustrating an example of a gate structure.

FIG. 5 is a perspective view illustrating an example of the gate structure 22. The gate structure 22 includes the gate valve G2, a base 220, a plurality of gate support portions 221, and a plurality of lifter pins 222. One end of each gate support portion 221 is fixed to the base 220, and the other end thereof is fixed to the gate valve G2. Each gate support portion 221 supports the gate valve G2 with respect to the base 220. One end of each lifter pin 222 is fixed to the base 220. The other end of each lifter pin 222 supports the substrate W. The gate support portion 221 is an example of a gate actuator.

Referring back to FIG. 4, the description will be continued. An outer shape of the gate valve G2 is greater than the inner shape of the opening 214. The base 220 is disposed in the second container 211. The support portion 23 supports the gate structure 22. The driving part 24 vertically moves the support portion 23. The support portion 23 is vertically moved by the driving part 24 so that the entirety of the gate structure 22 is vertically moved. The driving part 24 is configured to vertically move the substrate W through the opening 212 between a first position P1 in the container 21 and a second position P2 in the vacuum substrate transfer module 11. The first position P1 may be at the same height as the opening 214. For example, the first position P1 may be the height from a lower surface of the first container 210. The first position P1 may be a position at which the substrate W is transferred between the interior of the container 21 and the atmospheric substrate transfer module 17 through the opening 214. In the example shown in FIG. 4, the first position P1 is a position within a height direction range Δh of the opening 214.

In the present embodiment, since the entirety of the gate structure 22 is vertically moved, the plurality of gate support portions 221 and the plurality of lifter pins 222 included in the gate structure 22 are vertically moved together. As a result, the gate valve G2 and the substrate W supported by the plurality of lifter pins 222 are vertically moved at the same time.

Figure 6:
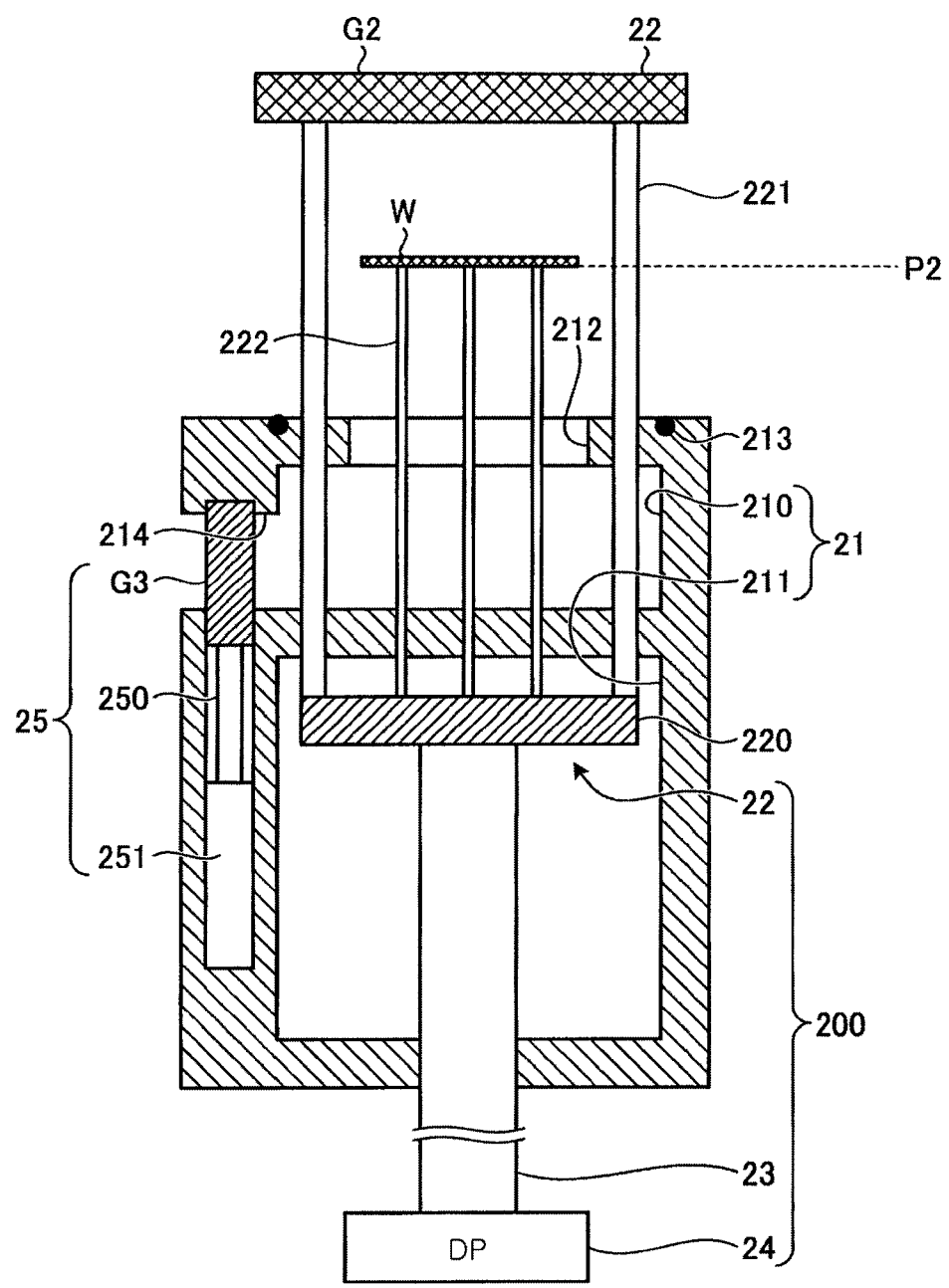
FIG. 6 is a cross-sectional view illustrating an example of the load lock module in a state in which a gate valve is opened.

For example, as shown in FIG. 4, as the gate structure 22 moves downward, the gate valve G2 comes into contact with the upper surface of the container 21. In this way, the interior of the container 21 of the load lock module 20 is blocked from communicating with the interior of the vacuum substrate transfer module 11. In addition, for example, as shown in FIG. 6, as the gate structure 22 is lifted, the gate valve G2 is also lifted. In this way, the interior of the first container 210 of the load lock module 20 may communicate with the interior of the vacuum substrate transfer module 11. As the gate structure 22 is lifted, the lifter pin 222 supporting the substrate W is lifted together with the gate valve G2. As a result, the substrate W may be taken out from the lifter pin 222 by the transfer robot 110 in the vacuum substrate transfer module 11, and the substrate W may also be placed on the lifter pin 222 by the transfer robot 110. When the substrate W is taken out from the lifter pin 222 by the transfer robot 110, the driving part 24 lifts the substrate W to the second position P2 in the vacuum substrate transfer module 11. For example, as shown in FIG. 6, the second position may be the height from the lower surface of the first container 210. In the present embodiment, the second position P2 is located higher than the first position P1.

The gate mechanism 25 is installed in the opening 214 of the container 21. The gate mechanism 25 includes the gate valve G3, a support portion 250, and a driving part 251. The support portion 250 supports the gate valve G3. The driving part 251 vertically moves the support portion 250. As the gate valve G3 is vertically moved by the driving part 251, the support portion 250 is vertically moved. As the gate valve G3 moves downward, the atmospheric substrate transfer module 17 and the load lock module 20 may communicate with each other through the opening 214. In addition, as the gate valve G3 is lifted to come into contact with an upper surface of the opening 214, the opening 214 is closed and the atmospheric substrate transfer module 17 is blocked from communicating with the load lock module 20.

(Transfer of Substrate W)

Figure 7:
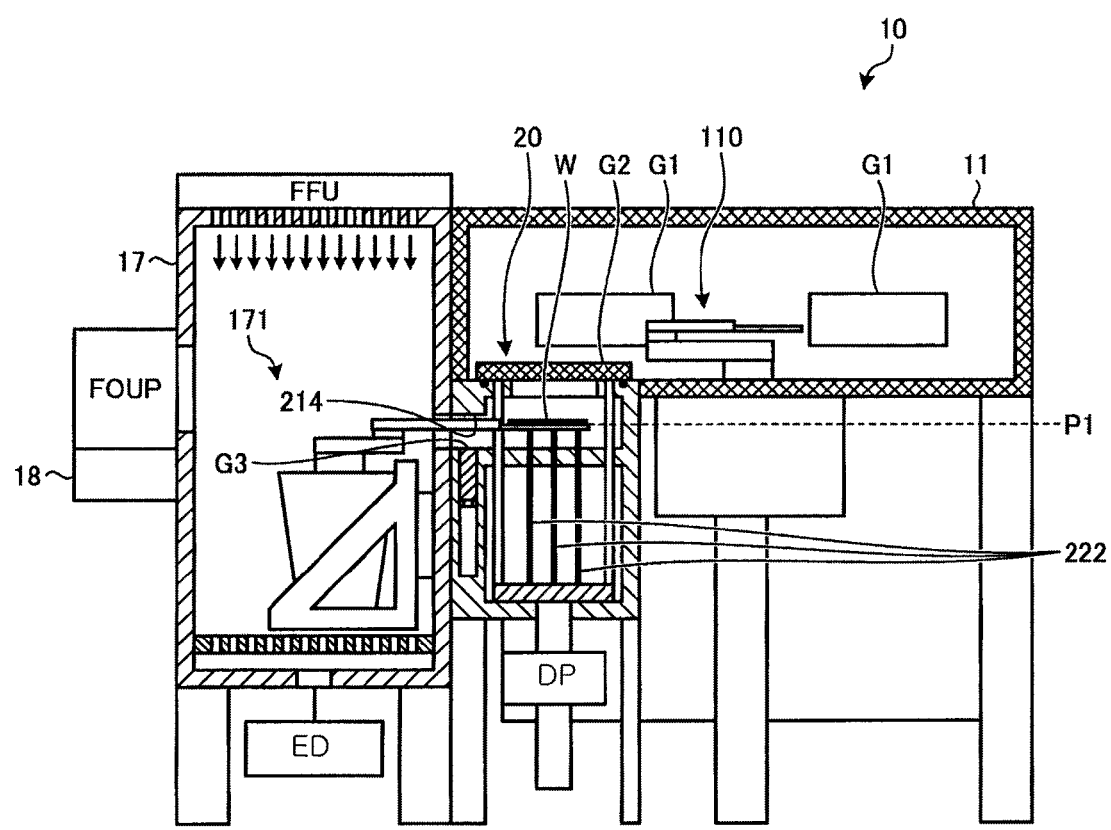
FIG. 7 is cross-sectional view illustrating an example of the substrate processing system when a substrate is transferred.
Figure 8:
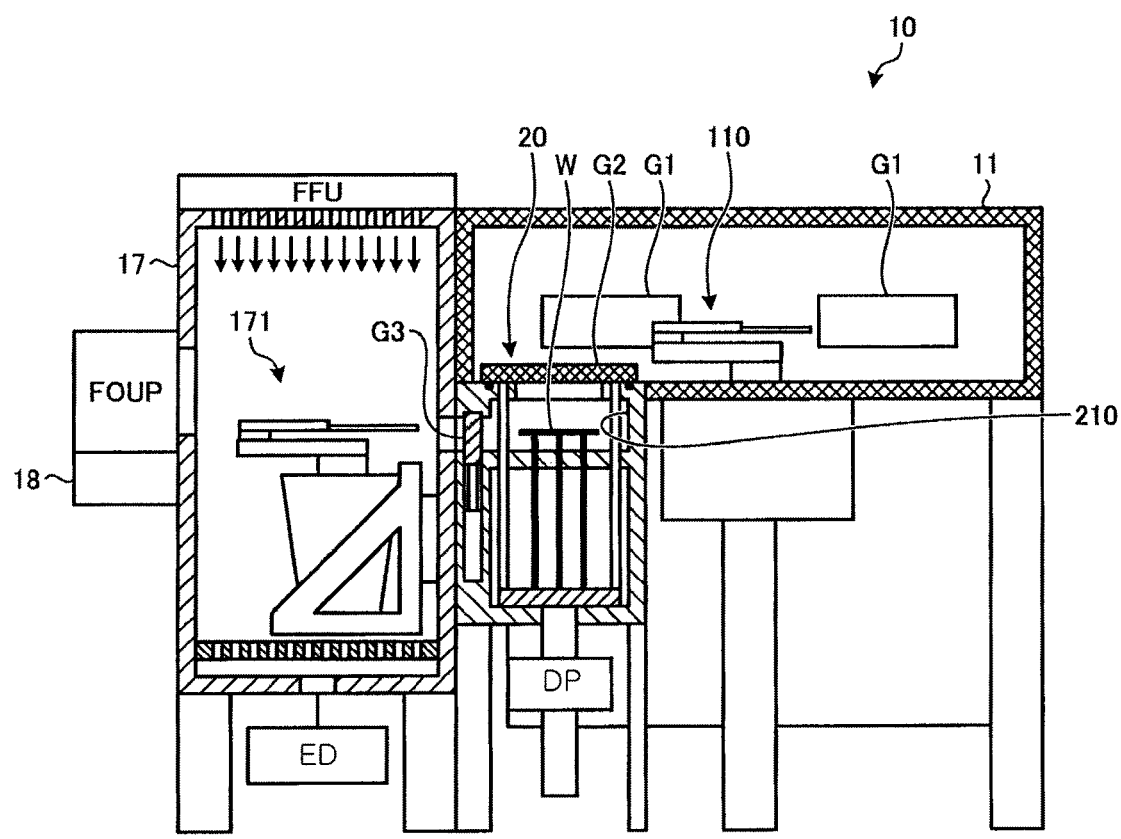
FIG. 8 is cross-sectional view illustrating an example of the substrate processing system when the substrate is transferred.
Figure 9:
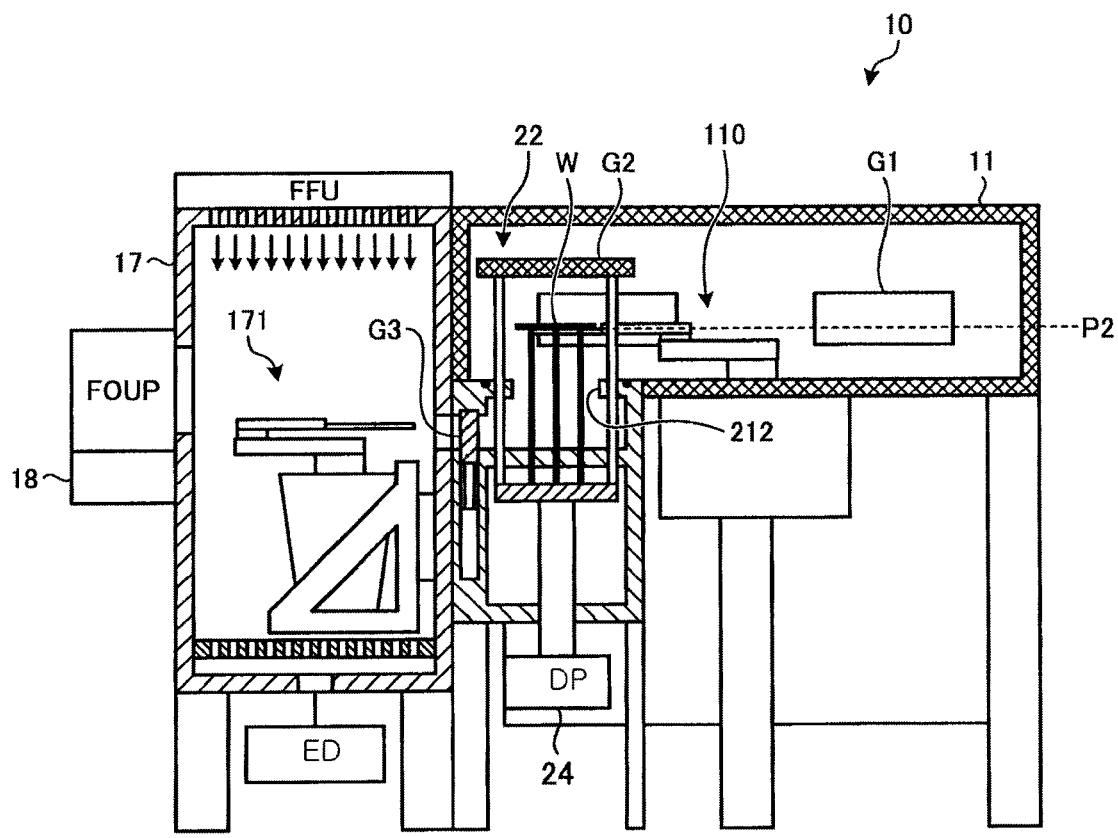
FIG. 9 is cross-sectional view illustrating an example of the substrate processing system when the substrate is transferred.

FIGS. 7 to 9 are cross-sectional views illustrating an example of the substrate processing system 1 when the substrate W is transferred. When the substrate W is to be transferred from the FOUP to the substrate processing module 12, the transfer robot 171 takes the substrate W out of the FOUP connected to the load port 18 and transfers the substrate W into the atmospheric substrate transfer module 17 under an atmospheric pressure atmosphere. For example, as shown in FIG. 7, the opening 214 is opened by the gate valve G3. The transfer robot 171 transfers the substrate W from the atmospheric substrate transfer module 17 into the load lock module 20 through the opening 214 and loads the substrate W on the lifter pin 222 in the load lock module 20.

Next, for example, as shown in FIG. 8, the transfer robot 171 retracts from the load lock module 20, and the opening 214 is closed by the gate valve G3. A gas in the first container 210 may be exhausted by the exhaust device (not shown), and a pressure in the first container 210 may be reduced to a predetermined pressure lower than the atmospheric pressure.

Next, for example, as shown in FIG. 9, the driving part 24 lifts the gate structure 22 under a vacuum atmosphere. As a result, the gate valve G2 is lifted and the opening 212 is opened such that the interior of the load lock module 20 can communicate with the vacuum substrate transfer module 11.

In this case, the substrate W is lifted from the first position P1 in the load lock module 20 to the second position P2 in the vacuum substrate transfer module 11. The substrate W is taken out from the lifter pin 222 by the transfer robot 110 under a vacuum atmosphere, and the gate structure 22 moves downward by the driving part 24. An opening of the substrate processing module 12 is opened by the gate valve G1, and the transfer robot 110 transfers the substrate W from the vacuum substrate transfer module 11 into the substrate processing module 12 through the corresponding opening.

When the substrate W is carried from the substrate processing module 12 to the FOUP, a procedure in the reverse order of the procedure depicted in FIGS. 7 to 9 is executed. That is, the opening of the substrate processing module 12 is opened by the gate valve G1, and the transfer robot 110 transfers the substrate W from the substrate processing module 12 into the vacuum substrate transfer module 11 under a vacuum atmosphere. For example, as shown in FIG. 9, the driving part 24 lifts the gate structure 22, and the transfer robot 110 loads the substrate W on the lifter pin 222. For example, as shown in FIG. 8, the gate structure 22 moves downward by the driving part 24 under a vacuum atmosphere. As a result, the gate valve G2 moves downward, and the opening 212 is closed by the gate valve G2. In this case, the substrate W moves from the second position P2 in the vacuum substrate transfer module 11 to the first position P1 in the load lock module 20.

Next, a gas (for example, air) may be supplied into the first container 210 using the gas supply device (not shown) so that a pressure in the first container 210 may be increased to the atmospheric pressure. For example, as shown in FIG. 7, the opening 214 is opened by the gate valve G3, and the transfer robot 171 takes out the substrate W from the lifter pin 222 under an atmospheric pressure atmosphere and transfers the substrate W to the FOUP through the atmospheric substrate transfer module 17.

The first embodiment has been described above. As described above, the substrate processing system 1 in this embodiment includes the vacuum substrate transfer module 11, the atmospheric substrate transfer module 17, and the load lock module 20 disposed on the side surface of the atmospheric substrate transfer module 17 and also disposed on the lower surface of the vacuum substrate transfer module 11. The load lock module 20 includes the container 21, the gate valve G2, the gate valve G3, and the actuator 200. The container 21 has the opening 212 and the opening 214. The opening 214 is formed in the side surface of the container 21 to communicate the interior of the container 21 with the atmospheric substrate transfer module 17. The opening 212 is formed in a lower or upper surface of the container 21 to communicate the interior of the container 21 with the vacuum substrate transfer module 11. The gate valve G3 may open or close the opening 214. The gate valve G2 may open or close the opening 212. The actuator 200 is configured to vertically move the substrate W through the opening 212 between the first position P1 in the container 21 and the second position P2 in the vacuum substrate transfer module 11. The first position P1 is located at the same height as the opening 214. As a result, the installation area of the substrate processing system 1 can be reduced.

In addition, in the first embodiment described above, the atmospheric substrate transfer module 17 includes the transfer robot 171. The transfer robot 171 is configured to transfer the substrate W through the opening 214 between the first position and the load lock module 20 connected to the atmospheric substrate transfer module 17. As a result, the substrate W can be transferred between the atmospheric substrate transfer module 17 and the load lock module 20.

In addition, in the first embodiment described above, the vacuum substrate transfer module 11 includes the transfer robot 110. The transfer robot 110 is configured to transfer the substrate W between the second position and the substrate processing module 12 connected to the vacuum substrate transfer module 11. As a result, the substrate W can be transferred between the load lock module 20 and the substrate processing module 12 under an atmosphere of a predetermined pressure lower than atmospheric pressure.

In addition, in the first embodiment described above, the load lock module 20 is disposed on the lower surface of the vacuum substrate transfer module 11, and the second position is located higher than the first position. As a result, the installation area of the substrate processing system 1 can be reduced.

Furthermore, in the first embodiment described above, the load lock module 20 includes the gate support portion 221. The gate support portion 221 is configured to vertically move the gate valve G2 between a closed position and an opened position. The closed position is a position at which the opening 212 is closed by the gate valve G2, and the opened position is located higher than the second position. As a result, the gate valve G2 located between the vacuum substrate transfer module 11 and the load lock module 20 can be opened or closed.

In addition, in the first embodiment described above, the gate support portion 221 is configured to vertically move the gate valve G2 together with the substrate W by the actuator 200. Thereby, a mechanism for vertically moving the gate support portion 221 is integrated in the actuator 200.

Furthermore, in the first embodiment described above, the actuator 200 includes the plurality of lifter pins 222 configured to support the substrate W and the driving part 24 configured to vertically move the plurality of lifter pins 222. With this configuration, the substrate W can be vertically moved.

In addition, the load lock module 20 in the first embodiment described above includes the container 21, the gate valve G3, the gate valve G2, and the actuator 200. The container 21 has the opening 212 and the opening 214. The opening 214 is formed in the side surface of the container 21 to communicate the interior of the container 21 with the atmospheric substrate transfer module 17. The opening 212 is formed in the lower or upper surface of the container 21 to communicate the interior of the container 21 with the vacuum substrate transfer module 11. The gate valve G3 may open or close the opening 214. The gate valve G2 may open or close the opening 212. The actuator 200 is configured to vertically move the substrate W through the opening 212 between the first position P1 inside the container 21 and the second position P2 outside the container 21. The first position P1 is at the same height as the opening 214.

Second Embodiment

In a second embodiment, a temperature adjustment part for adjusting a temperature of a processed substrate W is installed in a load lock module 20. When the processed substrate W is transferred into the load lock module 20 from a vacuum substrate transfer module 11, the processed substrate W is placed on the temperature adjustment part and exchanges heat with the temperature adjustment part so that a temperature of the processed substrate W is adjusted to a predetermined temperature. After the temperature of the processed substrate W is adjusted to the predetermined temperature, the processed substrate W is transferred from the load lock module 20 to an atmospheric substrate transfer module 17. In addition, the configuration of a substrate processing system 1 in the second embodiment may be the same as that of the substrate processing system 1 in the first embodiment described with reference to FIGS. 1 to 3 except for the aspects described below.

(Structure of Load Lock Module 20)

Figure 10:
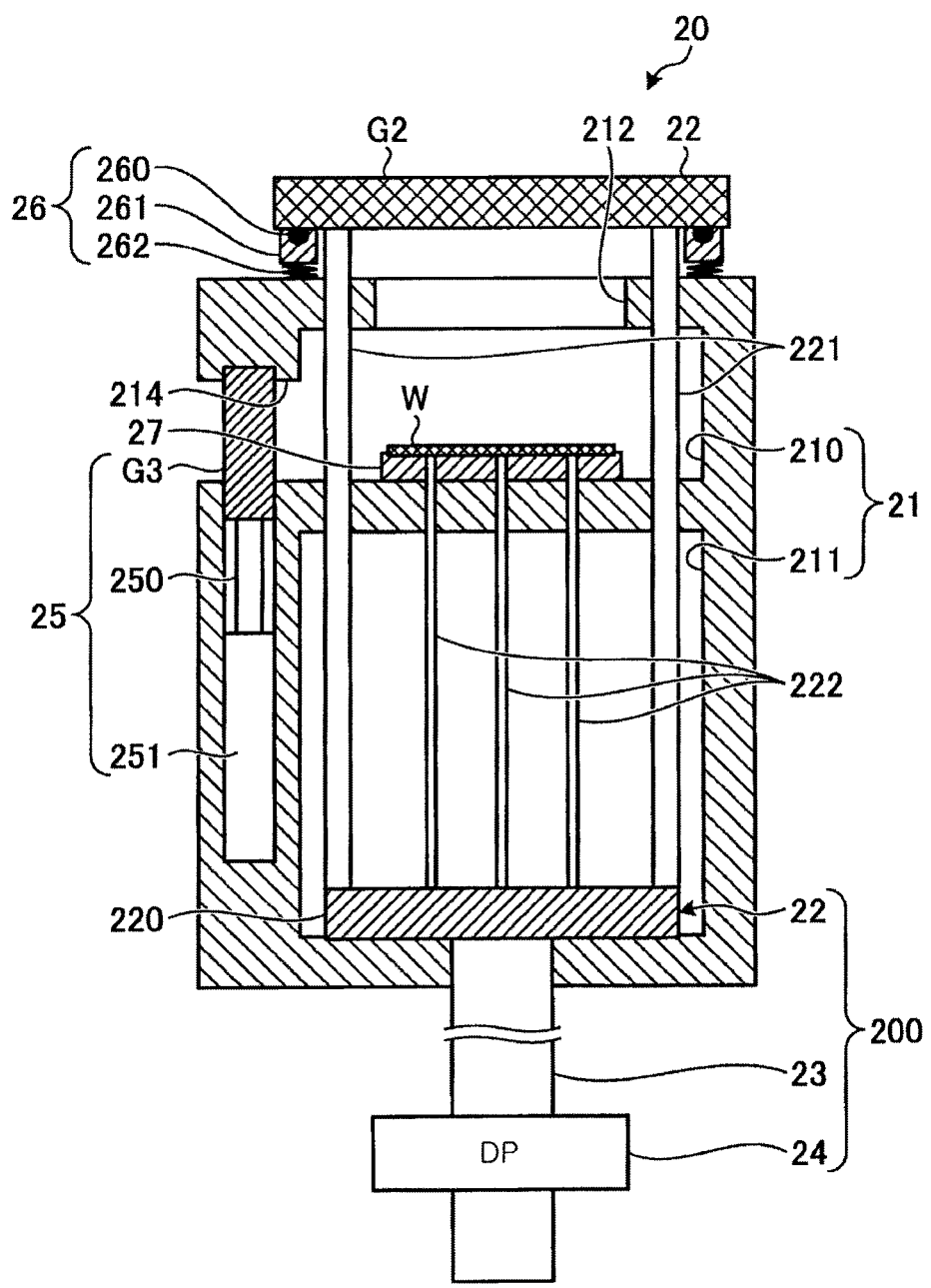
FIG. 10 is a cross-sectional view illustrating an example of a load lock module according to a second embodiment.

FIG. 10 is a cross-sectional view illustrating an example of the load lock module 20 according to the second embodiment. The load lock module 20 includes a container 21, a gate mechanism 25, a sealing mechanism 26, a temperature adjustment part 27, and an actuator 200. In addition, except for the aspects described below, components in FIG. 10 denoted by the same reference numerals as in FIG. 4 are the same or have the same function as the components shown in FIG. 4, and thus, redundant descriptions thereof are omitted.

The temperature adjustment part 27 for adjusting a temperature of the substrate W is installed in a first container 210. The processed substrate W is carried into the load lock module 20 from a vacuum substrate transfer module 11. For example, as shown in FIG. 10, the processed substrate W is placed on the temperature adjustment part 27. After a temperature of the substrate W is adjusted to a predetermined temperature, the processed substrate W is carried from the load lock module 20 to an atmospheric substrate transfer module 17. When the processed substrate W is carried from the load lock module 20 to the atmospheric substrate transfer module 17, the substrate W is lifted out of the temperature adjustment part 27 as lifter pins 222 move upward.

In the present embodiment, a gate support portion 221 configured to support a gate valve G2 and the lifter pins 222 configured to support the substrate W are vertically moved together by a driving part 24. When the lifter pins 222 are lifted, the gate support portion 221 and the gate valve G2 are also lifted. Accordingly, the blocking of the communication between the load lock module 20 and the vacuum substrate transfer module 11 may be released.

In order to avoid the release of the blocking, in the present embodiment, a sealing mechanism 26 is installed on an upper surface of the container 21 around an opening 212 so as to surround the opening 212. The sealing mechanism 26 includes a sealing member 260 such as an O-ring, a holding portion 261 for holding the sealing member 260, and a bellows 262 disposed between the holding portion 261 and an upper surface of the container 21. One end of the bellows 262 is fixed to the upper surface of the container 21, and the other end of the bellows 262 is fixed to the holding portion 261. Furthermore, the bellows 262 presses the holding portion 261 toward the gate valve G2.

Figure 11:
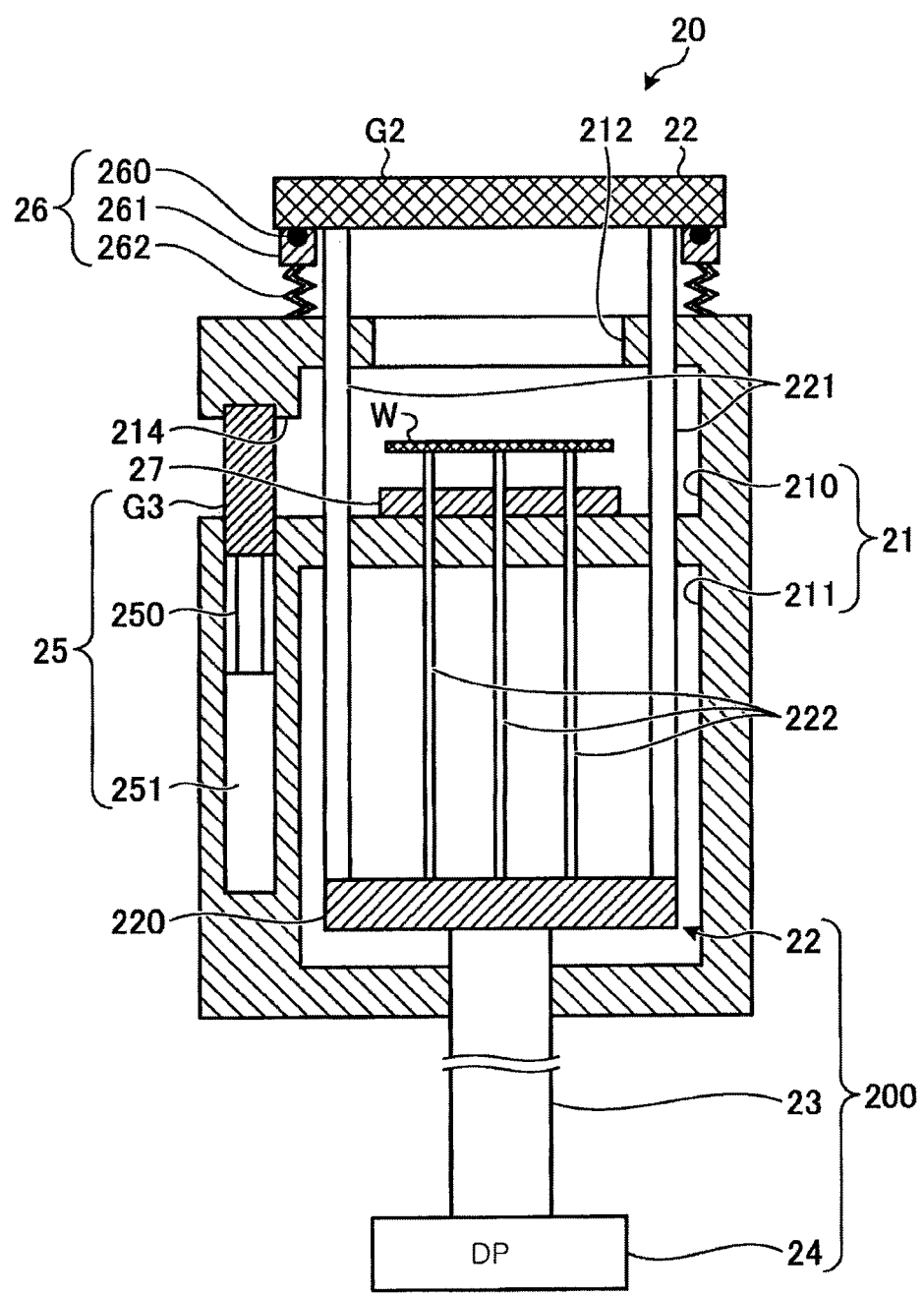
FIG. 11 is a cross-sectional view illustrating an example of the load lock module when a substrate is transferred between the load lock module and an atmospheric substrate transfer module according to the second embodiment.

As a result, even when the lifter pins 222 are lifted in order to carry the substrate W from the load lock module to the atmospheric substrate transfer module 17, the holding portion 261 is lifted as the gate valve G2 is lifted as shown in the example of FIG. 11. Accordingly, even when the gate valve G2 is lifted, a close contact between the gate valve G2 and the sealing member 260 can be maintained, and the communication between the load lock module 20 and the vacuum substrate transfer module 11 due to the gate valve G2 can be blocked.

Third Embodiment

Figure 12:
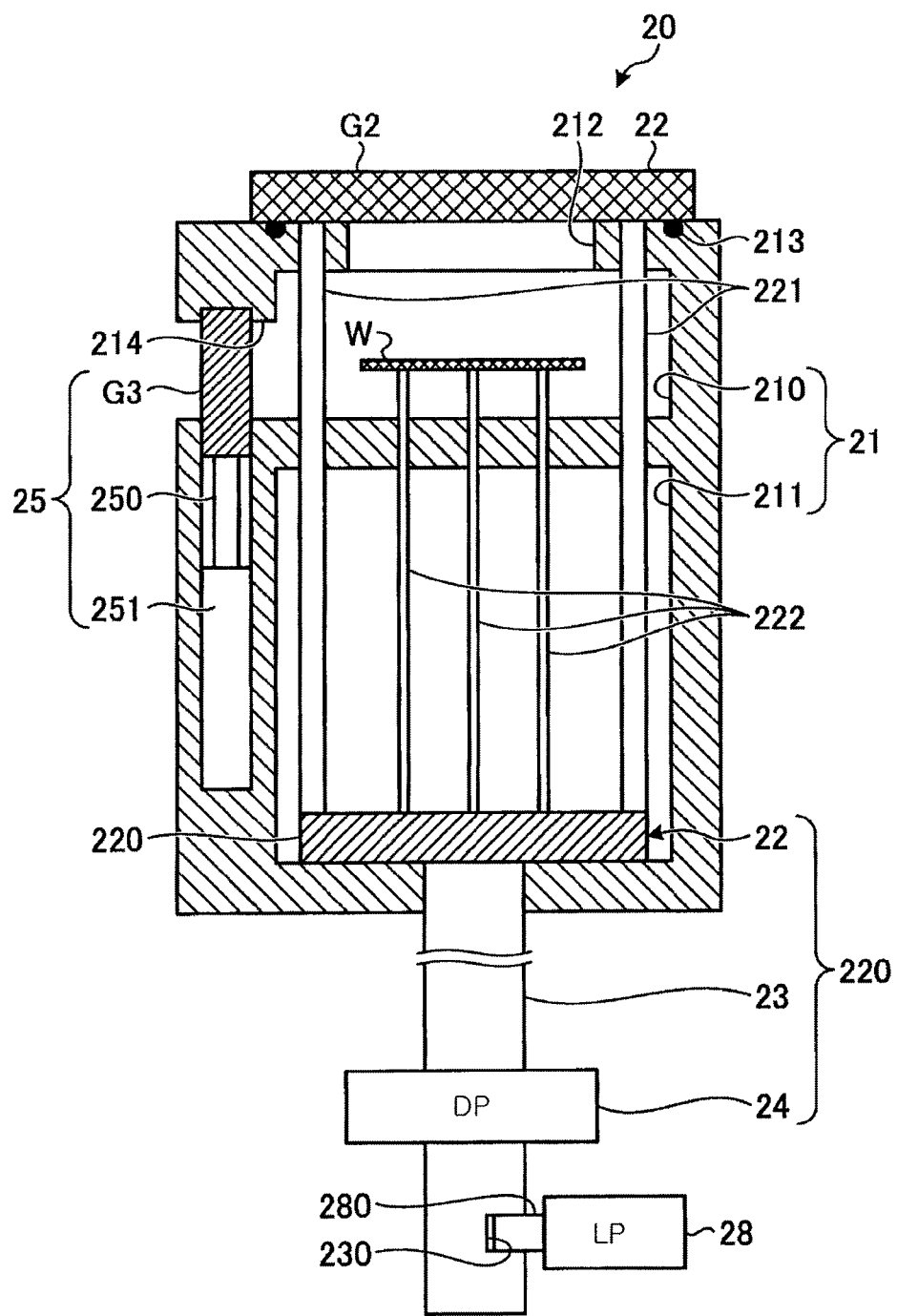
FIG. 12 is a cross-sectional view illustrating an example of a load lock module according to a third embodiment.

When a substrate W is transferred between an atmospheric substrate transfer module 17 and a load lock module 20, the interior of the load lock module 20 is maintained at atmospheric pressure. Meanwhile, since a pressure inside a vacuum substrate transfer module 11 is lower than atmospheric pressure, a force is applied to a gate valve G2 in a direction from the interior of the load lock module 20 toward the interior of the vacuum substrate transfer module 11. Therefore, in the present embodiment, when the communication between the load lock module 20 and the vacuum substrate transfer module 11 is blocked by the gate valve G2, a stopper 280 is inserted into a concave portion 230 formed in a support portion 23 by a lock portion (LP) 28, as shown in the example of FIG. 12. As a result, the movement of the support portion 23 is restricted, and the elevation of the gate valve G2 is restricted. Thus, when the substrate W is transferred between the atmospheric substrate transfer module 17 and the load lock module 20, there is no need for a driving part 24 to continuously apply a force for pulling the gate valve G2 downward. Therefore, it is possible to reduce the power consumption of the driving part 24. In addition, except for the load lock module 20, the remaining structure may be the same as that of the substrate processing system 1 in the first embodiment described with reference to FIGS. 1 to 3.

Fourth Embodiment

In the first to third embodiments described above, a gate valve G2 is installed on an upper surface of a container 21 and outside the container 21. However, in the fourth embodiment, the gate valve G2 is provided on the upper surface of the container 21 and inside the container 21. Thus, when a substrate W is transferred between an atmospheric substrate transfer module 17 and a load lock module 20, there is no need for a driving part 24 to continuously apply a force for pulling the gate valve G2 downward. Therefore, it is possible to reduce the power consumption of the driving part 24. In addition, except for the load lock module 20, the remaining structure may be the same as that of the substrate processing system 1 in the first embodiment described with reference to FIGS. 1 to 3.

(Structure of Load Lock Module 20)

Figure 13:
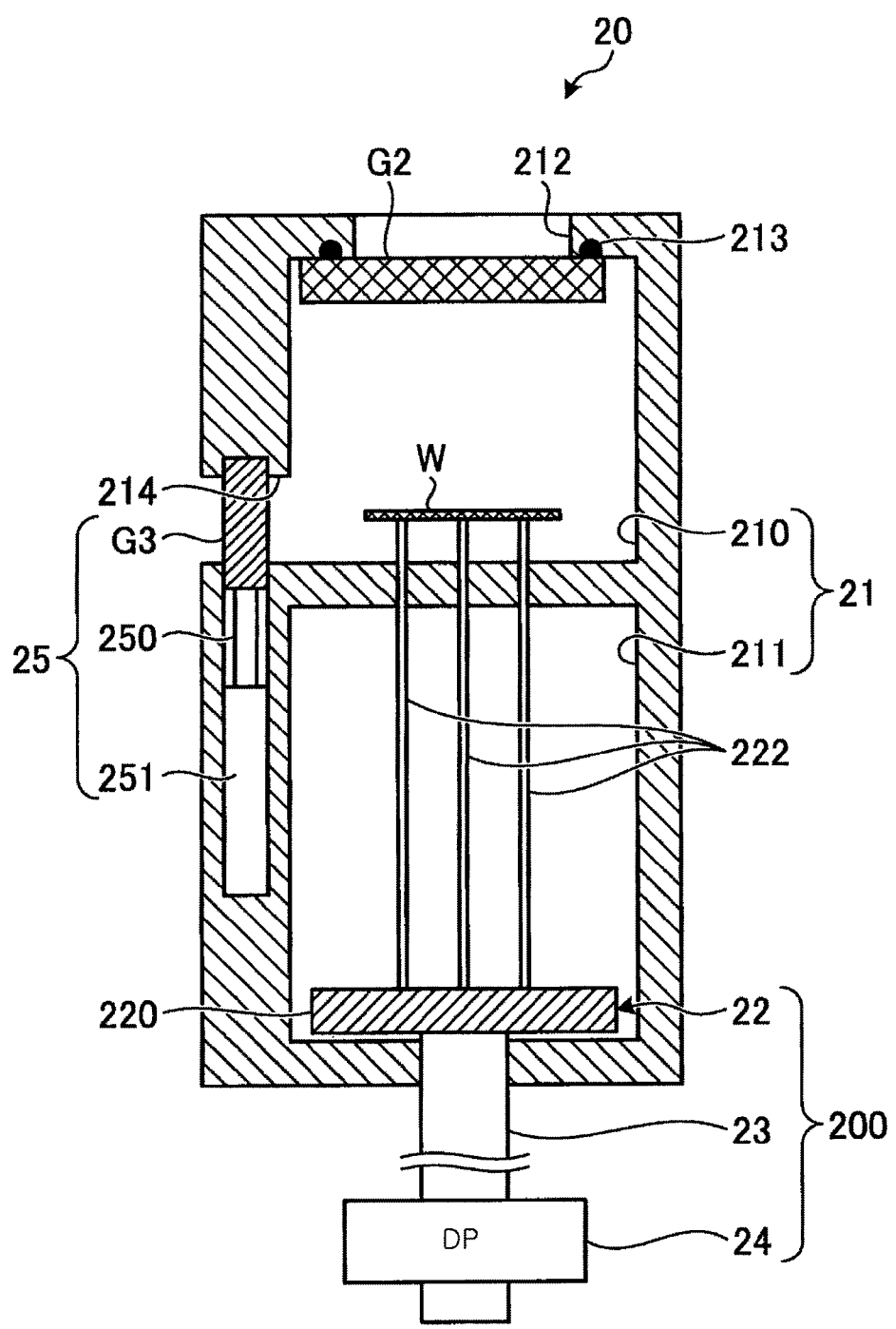
FIG. 13 is a cross-sectional view illustrating an example of a load lock module according to a fourth embodiment.

FIG. 13 is a cross-sectional view illustrating an example of the load lock module 20 according to a fourth embodiment. The load lock module 20 includes the container 21, a gate mechanism 25, and an actuator 200. The actuator 200 includes a gate structure 22, a support portion 23, and a driving part 24. The gate structure 22 includes a base 220 and a plurality of lifter pins 222. In addition, except for the aspects described below, components in FIG. 13 denoted by the same reference numerals as in FIG. 4 are the same or have the same function as the components shown in FIG. 4, and thus, redundant descriptions thereof are omitted.

In the present embodiment, the gate valve G2 is installed on an upper surface of the first container 210 and inside the first container 210. When the load lock module 20 is blocked from communicating with a vacuum substrate transfer module 11, the gate valve G2 comes into contact with the upper surface of the first container 210 inside the first container 210 as shown in the example of FIG. 13. When the substrate W is transferred between the atmospheric substrate transfer module 17 and the load lock module 20, a pressure inside the load lock module 20 is atmospheric pressure, and a pressure inside the vacuum substrate transfer module 11 is lower than the atmospheric pressure. Therefore, a force is applied to the gate valve G2 in a direction from the interior of the load lock module 20 toward the interior of the vacuum substrate transfer module 11.

However, in the present embodiment, the movement of the gate valve G2 in a direction from the interior of the load lock module 20 toward the interior of the vacuum substrate transfer module 11 is restricted by an upper portion of the load lock module 20. Therefore, when the substrate W is transferred between the atmospheric substrate transfer module 17 and the load lock module 20, there is no need for the driving part 24 to continuously apply a force for pulling the gate valve G2 downward. Therefore, it is possible to reduce the power consumption of the driving part 24.

Figure 14:
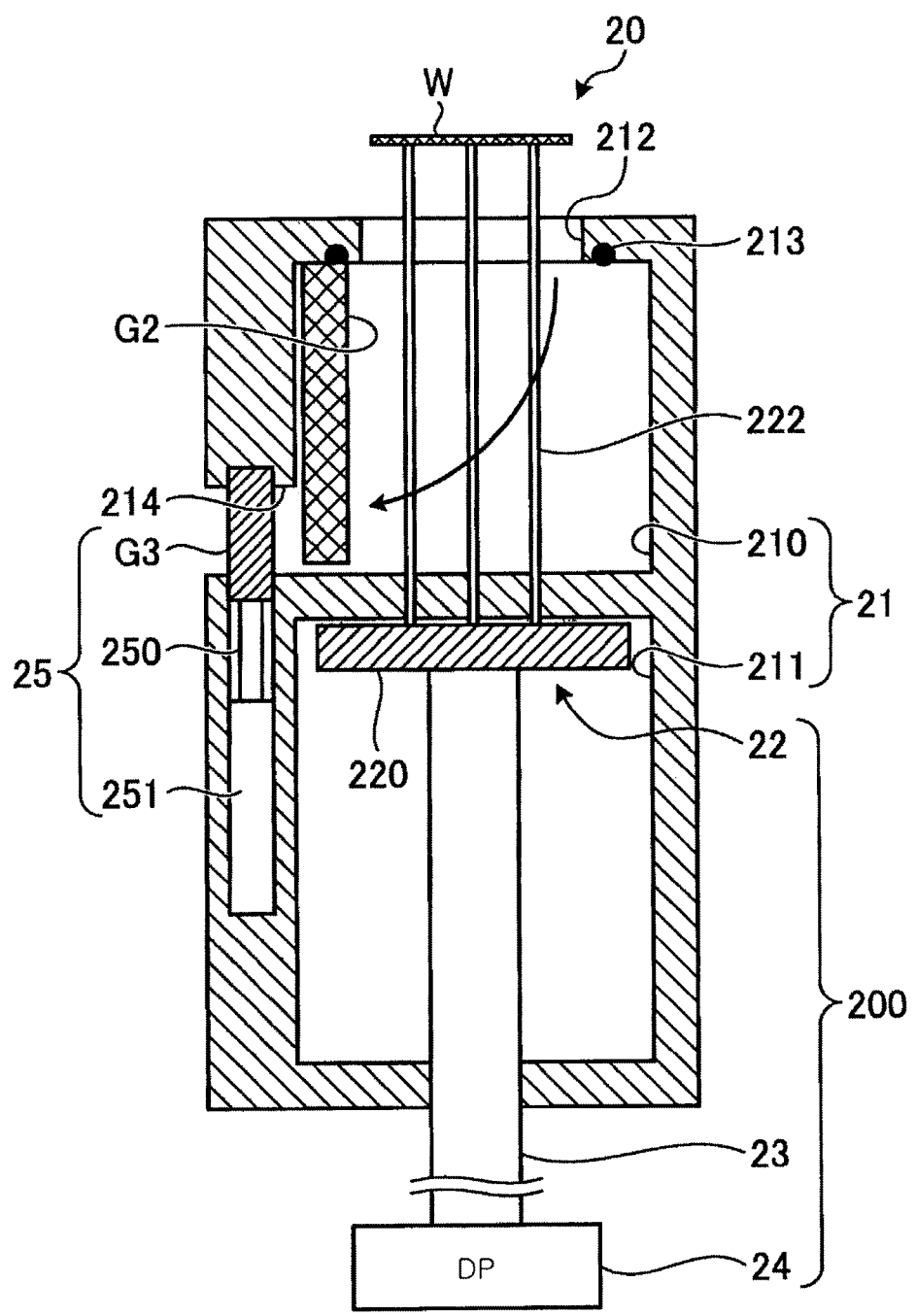
FIG. 14 is a cross-sectional view illustrating an example of the load lock module when a substrate is transferred between the load lock module and an atmospheric substrate transfer module according to the fourth embodiment.

When the load lock module 20 communicates with the vacuum substrate transfer module 11, the gate valve G2 retreats to the inside of the first container 210 as shown in the example of FIG. 14. Further, the gate structure 22 is lifted by the driving part 24, and the substrate W is taken out from the lifter pins 222 by a transfer robot 110 in the vacuum substrate transfer module 11.

Other Embodiments

The technique described in the present disclosure is not limited to the above-described embodiments and can be modified in various ways within the scope of the present disclosure.

Figure 15:
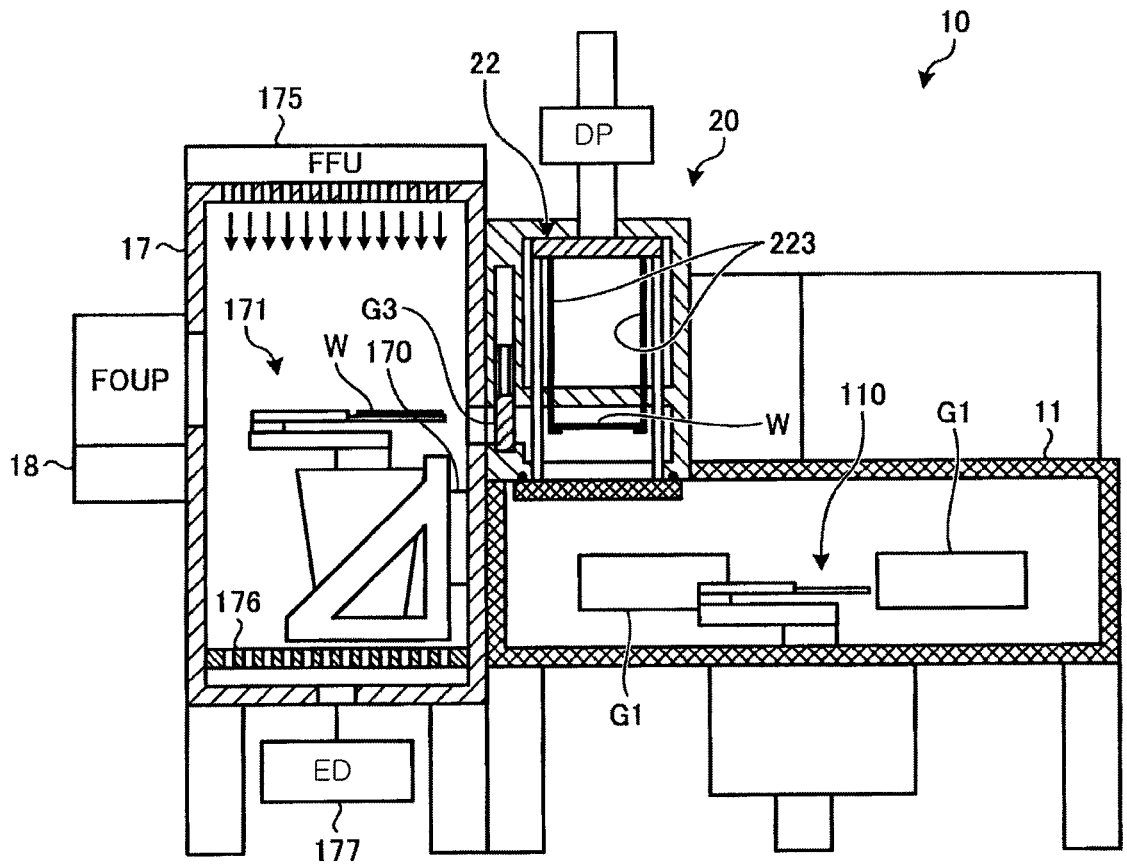
FIG. 15 is a cross-sectional view illustrating another embodiment of a substrate processing system.

For example, in each of the above-described embodiments, the load lock module 20 is installed on a lower surface of a vacuum substrate transfer module 11. However, the present disclosure is not limited thereto. As another embodiment, the load lock module 20 may be provided on an upper surface of the vacuum substrate transfer module 11 as shown in the example of FIG. 15. FIG. 15 is a cross-sectional view illustrating another embodiment of a substrate processing system 1. In the substrate processing system 1 shown in FIG. 15, a plurality of substrate holding portions 223 are installed in a gate structure 22 of the load lock module 20.

Figure 16:
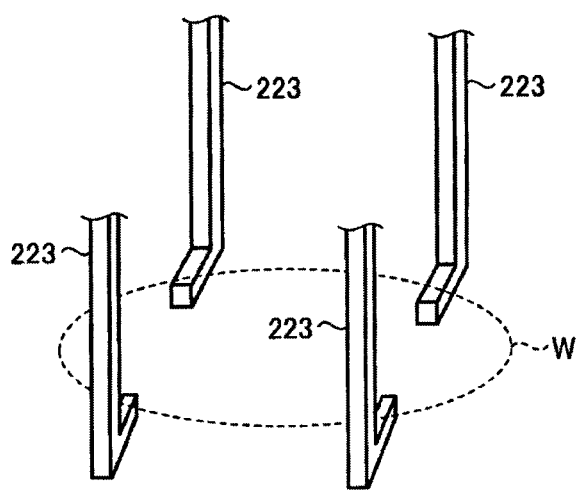
FIG. 16 is a perspective view illustrating an example of substrate holding portions.

FIG. 16 is a perspective view illustrating an example of the substrate holding portions 223. The substrate holding portions 223 hold a substrate W by using a hook-shaped leading end portion thereof. In the example of FIG. 16, the substrate W is supported by four substrate holding portions 223, but the number of the substrate holding portions 223 supporting the substrate W may be three or more or may be five or more.

Figure 17:
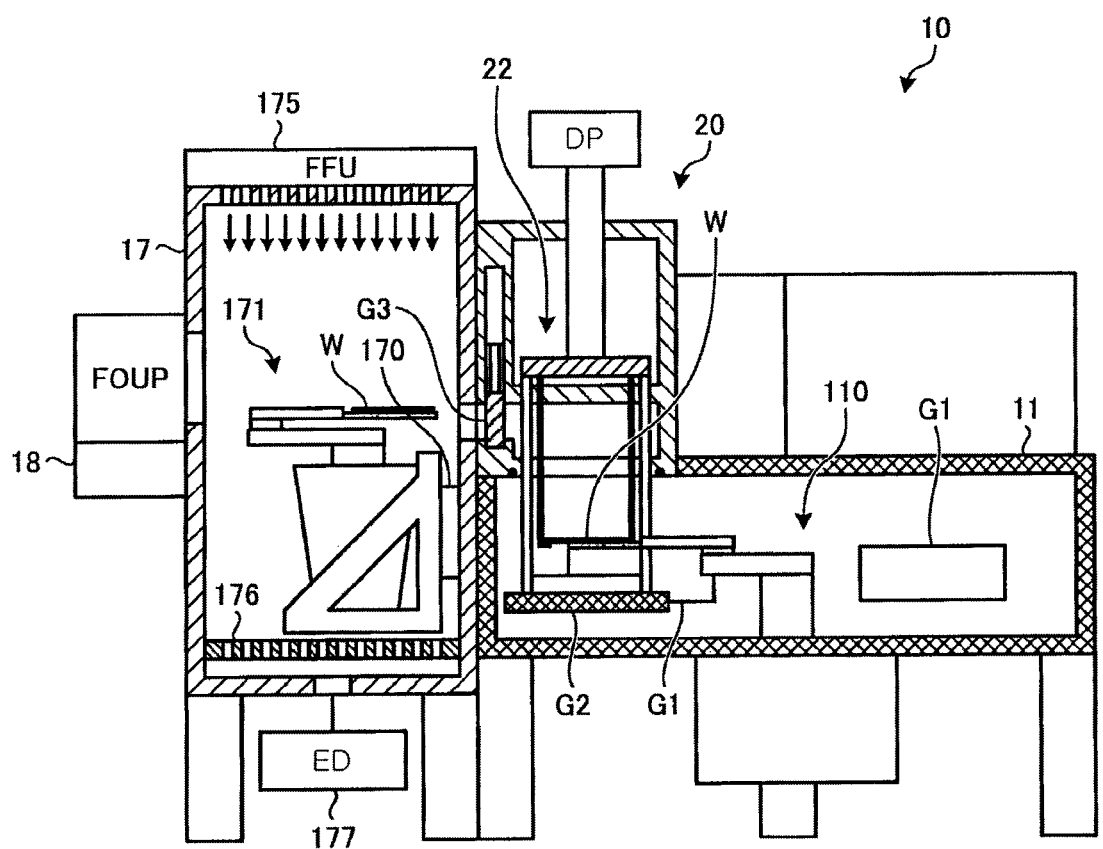
FIG. 17 is a cross-sectional view illustrating an example of a substrate processing system when a substrate is transferred between a load lock module and a vacuum substrate transfer module.

When the substrate W is transferred between the load lock module 20 and the vacuum substrate transfer module 11, the gate structure 22 moves downward as shown in the example of FIG. 17. As a result, a gate valve G2 and the substrate W move downward, and the vacuum substrate transfer module 11 and the load lock module 20 may communicate with each other. The substrate W is taken out from the substrate holding portion 223 by a transfer robot 110 in the vacuum substrate transfer module 11, and the substrate W is loaded on the substrate holding portion 223 by the transfer robot 110.

In addition, in each of the above-described embodiments, two load lock modules 20 are installed on the lower surface of the vacuum substrate transfer module 11, but the disclosed technology is not limited thereto. In another embodiment, at least one load lock module 20 may be installed on each of the upper and lower surfaces of the vacuum substrate transfer module 11.

Furthermore, in the first to third embodiments described above, the gate support portion 221 and the lifter pins 222 are lifted together by the driving part 24, but the disclosed technology is not limited thereto. The gate support portion 221 and the lifter pins 222 may be fixed to separate bases 220, and the bases 220 may be vertically moved independently by separate driving parts 24. As a result, even when a temperature adjustment part is installed in the load lock module 20, the substrate W can be vertically moved independently of the opening or closing of the gate valve G2.

Furthermore, in each of the above-described embodiments, the vacuum substrate transfer module 11, the atmospheric substrate transfer module 17, and the load lock module 20 transfer the substrate W, but the disclosed technology is not limited thereto. In another embodiment, the vacuum substrate transfer module 11, the atmospheric substrate transfer module 17, and the load lock module 20 may transfer an edge ring in addition to the substrate W. A stage on which the substrate W is placed is installed in each substrate processing module 12, and the edge ring is installed on the stage so as to surround the substrate W. Since the edge ring is consumed through a process such as etching of the substrate W, the edge ring is replaced at a predetermined timing.

The presently disclosed embodiments are considered in all respects to be illustrative and are not restrictive. The above-described embodiments can be embodied in various forms. Further, the above-described embodiments may be omitted, replaced, or changed in various forms without departing from the scope of the appended claims and the gist thereof.

The invention claimed is:

1. A substrate transfer system comprising:
an atmospheric substrate transfer module;
a vacuum substrate transfer module; and
a load lock module disposed on a side surface of the atmospheric substrate transfer module and disposed on an upper surface or a lower surface of the vacuum substrate transfer module,
wherein the load lock module includes:
a container having a first substrate transfer opening and a second substrate transfer opening, the first substrate transfer opening being formed in a side surface of the container to communicate an interior of the container with the atmospheric substrate transfer module, and the second substrate transfer opening being formed in a lower surface or an upper surface of the container to communicate the interior of the container with the vacuum substrate transfer module;
a first gate configured to open or close the first substrate transfer opening;
a second gate configured to open or close the second substrate transfer opening; and
a substrate actuator configured to vertically move a substrate through the second substrate transfer opening between a first position in the container and a second position in the vacuum substrate transfer module, the first position being located at the same height as the first substrate transfer opening,
wherein the load lock module is disposed on the lower surface of the vacuum substrate transfer module,
the second position is located higher than the first position,
the load lock module includes a gate actuator configured to vertically move the second gate between a closed position and an opened position,
the closed position is a position at which the second substrate transfer opening is closed by the second gate, and
the opened position is located higher than the second position.

2. The substrate transfer system of claim 1, wherein the atmospheric substrate transfer module includes a first transfer robot configured to transfer the substrate through the first substrate transfer opening between the first position and a load port connected to the atmospheric substrate transfer module.

3. The substrate transfer system of claim 2, wherein the vacuum substrate transfer module includes a second transfer robot configured to transfer the substrate between the second position and a substrate processing module connected to the vacuum substrate transfer module.

4. The substrate transfer system of claim 1, wherein the vacuum substrate transfer module includes a second transfer robot configured to transfer the substrate between the second position and a substrate processing module connected to the vacuum substrate transfer module.

5. The substrate transfer system of claim 1, wherein the gate actuator is configured to vertically move the second gate separately from the substrate.

6. The substrate transfer system of claim 5, wherein the substrate actuator includes
a plurality of lifter pins configured to support the substrate and being movable vertically.

7. The substrate transfer system of claim 1, wherein the gate actuator is configured to vertically move the second gate together with the substrate.

8. The substrate transfer system of claim 7, wherein the substrate actuator includes
a plurality of lifter pins configured to support the substrate and being movable vertically.

9. The substrate transfer system of claim 1, wherein the substrate actuator includes
a plurality of lifter pins configured to support the substrate and being movable vertically.

10. A load lock module comprising:
a container having a first substrate transfer opening and a second substrate transfer opening, the first substrate transfer opening being formed in a side surface of the container to communicate an interior of the container with an atmospheric substrate transfer module, and the second substrate transfer opening being formed in a lower surface or an upper surface of the container to communicate the interior of the container with a vacuum substrate transfer module;
a first gate configured to open or close the first substrate transfer opening;
a second gate configured to open or close the second substrate transfer opening; and
a substrate actuator configured to vertically move a substrate through the second substrate transfer opening between a first position inside the container and a second position outside the container, wherein the first position is located at the same height as the first substrate transfer opening,
wherein the second position is located higher than the first position,
the load lock module includes a gate actuator configured to vertically move the second gate between a closed position and an opened position,
the closed position is a position at which the second substrate transfer opening is closed by the second gate, and
the opened position is located higher than the second position.

11. The load lock module of claim 10, wherein the substrate actuator includes a plurality of lifter pins configured to support the substrate and being movable vertically.

\* \* \* \* \*